(12) United States Patent
Tsujikawa et al.

(10) Patent No.: US 6,183,920 B1
(45) Date of Patent: Feb. 6, 2001

(54) SEMICONDUCTOR DEVICE GEOMETRICAL PATTERN CORRECTION PROCESS AND GEOMETRICAL PATTERN EXTRACTION PROCESS

(75) Inventors: Hiroyuki Tsujikawa, Kusatsu; Hidenori Shibata, Shijonawate; Kiyohito Mukai, Habikino, all of (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 09/348,316

(22) Filed: Jul. 7, 1999

(30) Foreign Application Priority Data

Jul. 8, 1998 (JP) .................................................. 10-192888

(51) Int. Cl.$^7$ ....................................................... G03F 9/00
(52) U.S. Cl. ............................................ 430/30; 430/311
(58) Field of Search ........................................ 430/30, 311

(56) References Cited

U.S. PATENT DOCUMENTS

| | | | |
|---|---|---|---|
| 5,573,890 | 11/1996 | Spence | 430/311 |
| 5,663,893 | 9/1997 | Wampler et al. | 364/491 |
| 5,702,848 | 12/1997 | Spence | 430/5 |
| 5,740,068 | 4/1998 | Liebmann et al. | 364/489 |
| 5,795,688 | 8/1998 | Burdorf et al. | 430/30 |
| 5,885,748 | 3/1999 | Ohnuma | 430/296 |

*Primary Examiner*—Christopher G. Young
(74) *Attorney, Agent, or Firm*—Stevens, Davis, Miller & Mosher, L.L.P.

(57) ABSTRACT

A semiconductor device geometrical pattern correction process, semiconductor device manufacturing process and geometrical pattern extraction process are provided, which make it possible to eliminate the adverse effect of corner rounding accompanying miniaturization, that is, a decrease in the projection amount of a gate, while avoiding increased chip area. The correction process comprises a step 102 of detecting a concave diffusion layer corresponding portion and a step 103 of correcting either the concave diffusion layer corresponding portion or a transistor gate corresponding portion which projects from the concave diffusion layer corresponding portion in order to ensure the projection of the gate from the concave diffusion layer corresponding portion against possible corner rounding.

21 Claims, 16 Drawing Sheets

FIG. 3
(a)
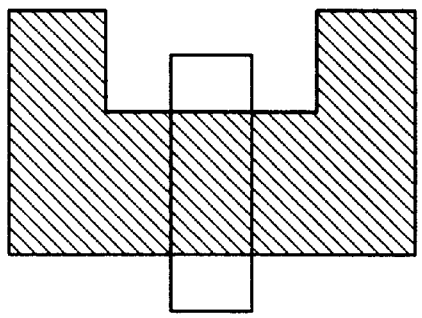
(b)
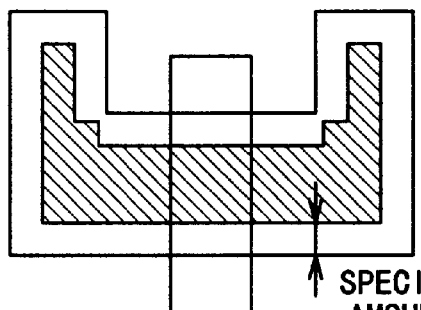
SPECIFIED AMOUNT A
(c)
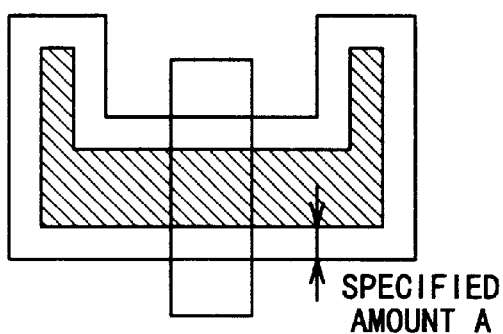
SPECIFIED AMOUNT A
(d)
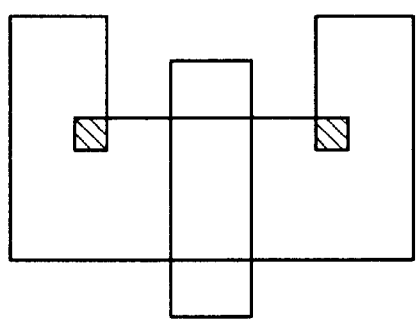
(e)
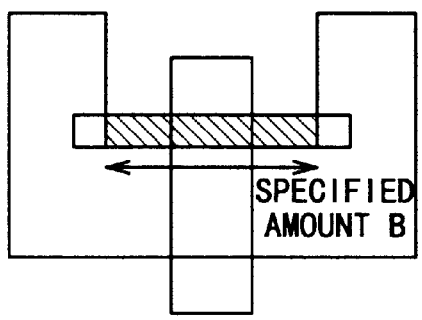
SPECIFIED AMOUNT B

FIG. 4
LOGICAL OPERATION STEP (SUBTRACTION) — 301
FIG. 5
(a)
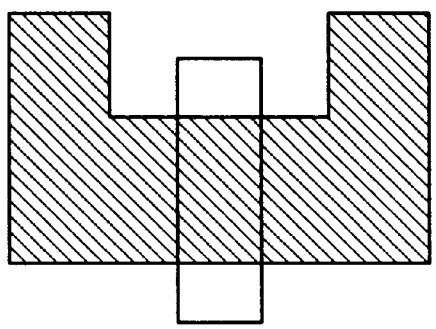
(b)
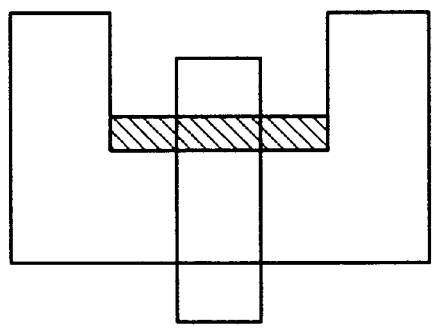
(c)
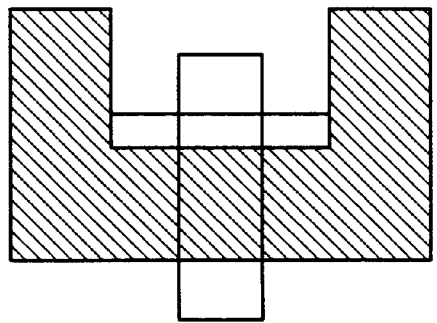

FIG. 9
(a)
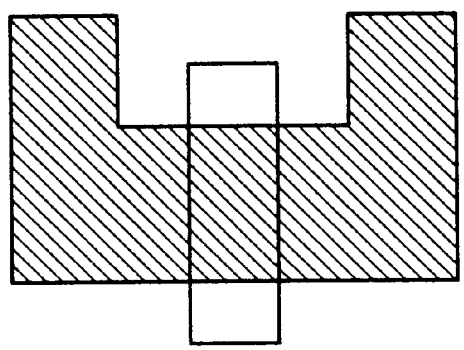
(b)
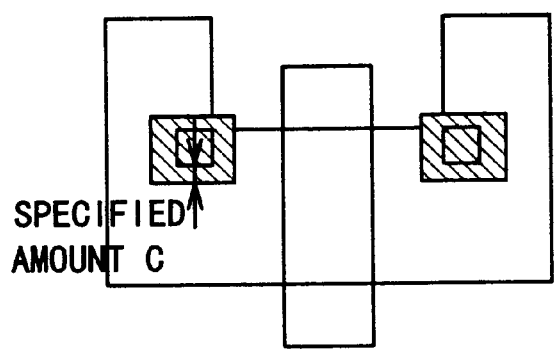
SPECIFIED AMOUNT C
(c)
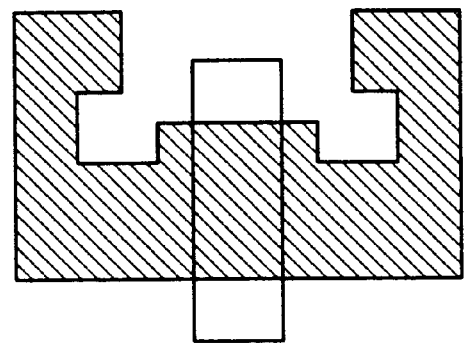

F I G. 1 3
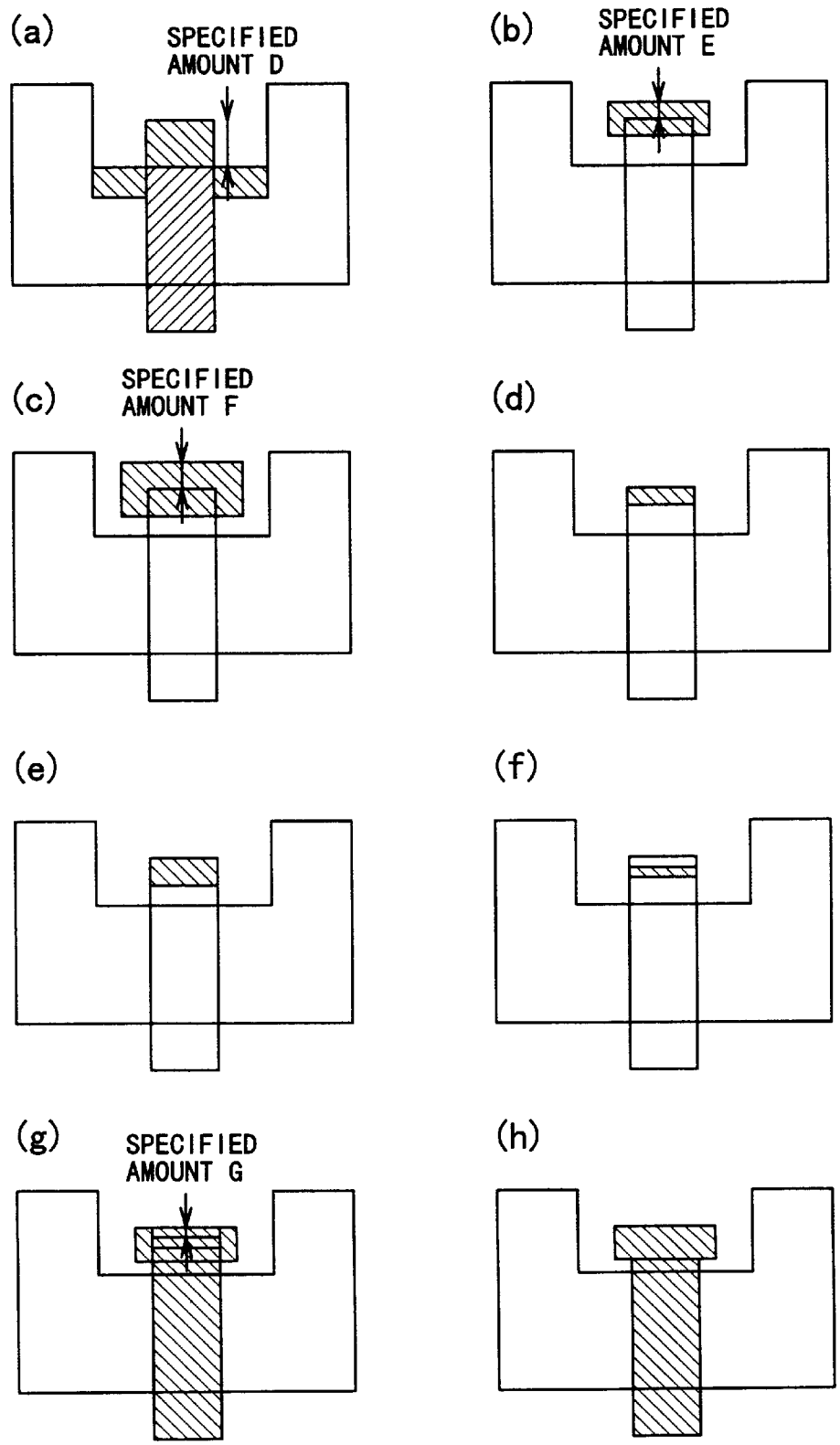

FIG. 20
(a)
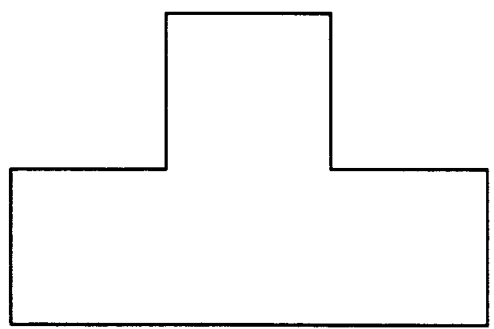
(b)
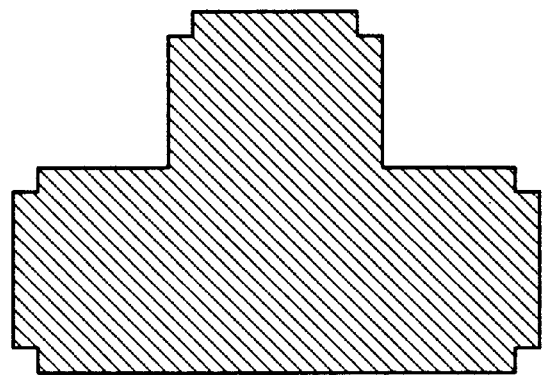
(c)
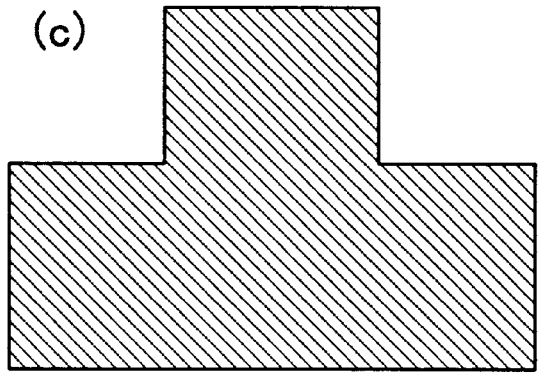
(d)
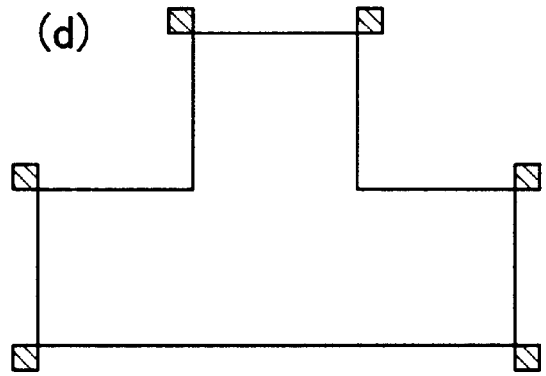
(e)
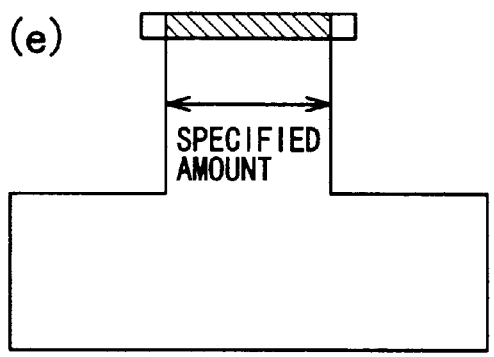
SPECIFIED AMOUNT

SEMICONDUCTOR DEVICE GEOMETRICAL PATTERN CORRECTION PROCESS AND GEOMETRICAL PATTERN EXTRACTION PROCESS

BACKGROUND OF THE INVENTION

1. Field of the Invention

The present invention relates to a semiconductor device geometrical pattern correction process for making advance changes, in a mask geometrical pattern for use in the manufacture of semiconductor devices or the like in order to obtain a transferred image that is close to a desired design pattern. The invention also relates to a semiconductor device manufacturing process and a geometrical pattern extraction process adapted for use in the above correction process.

2. Prior Art

Current techniques for manufacturing semiconductor devices and the like essentially require a photographic step in which a mask geometrical pattern for semiconductor devices is transferred to a resist material on a semiconductor substrate by use of an exposure light source.

In recent years, miniaturization in semiconductor device manufacturing processes is advancing at a pace faster than that of reduction in the wavelengths of exposure light sources. This has brought about a strong need for a photographic step in which transferring is carried out with a pattern having a size equivalent to or less than the wavelength of an exposure light source. As a result, there often arises the problem of the difference between a geometrical pattern obtained after transferring and its associated mask geometrical pattern initially designed.

One of the causes of such a difference in pattern is "corner rounding" which causes, after transferring, depressions in irregular geometry designed as a mask geometrical pattern. If a depression occurs in a convex gate portion of a transistor or in a concave diffusion layer portion which receives the projection of a gate, a desired amount of projection of the gate from the diffusion layer can be no longer ensured. This leads to electrical continuity between the source and drain of the transistor, resulting in increases in the current of the power source and even a failure in operation in the worst case, where a semiconductor device formed from such a pattern is used. As a matter of course, it is necessary to devise a measure to prevent such problematic depressions in semiconductor devices.

With reference to the accompanying drawings, there will be explained one attempt that has been previously made to eliminate the adverse effect of corner rounding on the projection amount of a gate.

FIGS. 21 and 22 show one example in which no measure is taken to ensure a satisfactory gate projection amount.

In the mask geometrical pattern shown in FIG. 21, a transistor gate 511 projects from a diffusion layer 513. In this pattern, a measure to compensate for a decrease in the projection amount of the gate is not taken, and therefore another pattern 512 can be made. However, the gate of the mask geometrical pattern shown in FIG. 22 obtained after transferring stands back because of corner rounding so that the source and drain of the diffusion layer are short-circuited.

FIGS. 23 and 24 show one example of conventional techniques for preventing a decrease in the projection amount of a gate.

According to the conventional technique depicted in FIG. 23, a portion which is likely to decrease in projection amount after transferring because of corner rounding is detected at the stage of designing a mask geometrical pattern and the mask geometrical pattern is modified to compensate for possible decreases. Therefore, the mask geometrical pattern obtained after transferring has an appropriate gate projection amount in spite of a depression in the gate atributable owing to corner rounding.

The above conventional technique, however, reveals the problem that since the projection amount of the gate in the mask geometrical pattern is increased, there is no space to accommodate another pattern 512 because of the occupation of the increased gate portion. More specifically, the mask geometrical pattern shown in FIG. 23 which has been modified to compensate for a decrease in gate projection amount does not have a space for the placement of the pattern 512, while the mask geometrical pattern shown in FIG. 21 which has not undergone such modification can include the pattern 512. This is a disadvantage to the conventional technique in view of effective space utilization and reduction in chip area.

The area of chips is the most critical factor in determining the cost of chips as well as in developing economically competitive chips.

The present invention is directed to overcoming the above problems presented by the prior art and one of the objects of the invention is therefore to provide a semiconductor device geometrical pattern correction process, semiconductor device manufacturing process and geometrical pattern extraction process, which are capable of compensating for a decrease in the projection amount of a gate due to corner rounding which accompanies miniaturization, while avoiding increased chip area.

SUMMARY OF THE INVENTION

According to the invention, there is provided a semiconductor device geometrical pattern correction process comprising the steps of:

detecting a concave diffusion layer corresponding portion; and correcting at least either the concave diffusion layer corresponding portion or a transistor gate corresponding portion which projects from the concave diffusion layer corresponding portion in order to ensure the projection of a gate from the concave diffusion layer corresponding portion against possible corner rounding.

The semiconductor device geometrical pattern correction process of the invention is arranged such that, with a view to compensating for a decrease in the projection amount of a gate owing to corner rounding, modification of the diffusion layer by reduction or modification of the transistor gate by enlargement is made in the transistor gate corresponding portion which projects from the concave diffusion layer corresponding portion on the semiconductor device mask geometrical pattern, so that gate depression with a decreased projection amount owing to corner rounding induced after the photographic step can be compensated.

In accomplishing the above primary object, the invention does not cause increased chip area, which is a problem presented by conventional techniques, so that the invention can thus contribute to the development of competitive chips. In addition, since the measure is focused on the compensation for a decrease in the projection amount of the gate, the amount of data that accompany the measure can be minimized and mask fabrication problems can be eliminated.

In the above arrangement, the step of correcting the concave diffusion layer corresponding portion is designed to make correction by reduction of the base of the concave portion and may include the step of performing geometrical pattern logical operation.

The step of correcting the concave diffusion layer corresponding portion is designed to make correction by reduction of the base of the concave portion and reduction of regions of sides which respectively contact the base in the concave portion, the regions being in the vicinity of the ends of the base. This step may include the steps of correcting a geometrical pattern and performing geometrical pattern logical operation.

The step of correcting the transistor gate projecting from the concave diffusion layer corresponding portion is designed to make correction by enlargement of regions of sides which respectively contact an end line in the transistor gate, the regions being positioned in the vicinity of both ends of the end line. This step may include the steps of measuring the difference between two geometrical patterns, correcting a geometrical pattern and performing geometrical pattern logical operation.

The step of correcting a transistor gate corresponding portion projecting from the concave diffusion layer corresponding portion is designed to make correction by enlargement of an end line of the transistor gate corresponding portion and enlargement of regions of sides which respectively contact the end line in the transistor gate corresponding portion, the regions being positioned in the vicinity of both ends of the end line. This step may include the steps of measuring the difference between two geometrical patterns, moving the sides of a geometrical pattern, correcting a geometrical pattern and performing geometrical pattern logical operation.

The step of correcting the concave diffusion layer corresponding portion may include the steps of moving the sides of a geometrical pattern, correcting a geometrical pattern, performing logical operation on the geometrical pattern obtained after the side movement and the geometrical pattern obtained after the correction, and making space measurement in the geometrical pattern obtained after the logical operation.

According to the invention, there is provided a semiconductor device manufacturing process including a photographic step with a mask geometrical pattern that has been corrected by correcting at least either a concave diffusion layer corresponding portion or a transistor gate corresponding portion which projects from the concave diffusion layer corresponding portion, by use of the semiconductor device geometrical pattern correction process.

The semiconductor device manufacturing process may include a photographic step with a mask geometrical pattern that has been corrected by reduction of the base of a concave portion, by use of the semiconductor device geometrical pattern correction process.

The semiconductor device manufacturing process may include a photographic step with a mask geometrical pattern that has been corrected, using the semiconductor device geometrical pattern correction process, by reduction of the base of a concave portion and reduction of regions of sides that respectively contact the base in the concave portion, the regions being positioned in the vicinity of both ends of the base.

The semiconductor device manufacturing process may include a photographic step with a mask geometrical pattern that has been corrected, using the semiconductor device geometrical pattern correction process, by enlargement of regions of sides that respectively contact an end line in a transistor corresponding portion projecting from a concave diffusion layer corresponding portion, the regions being positioned in the vicinity of both ends of the end line.

The semiconductor device manufacturing process may include a photographic step with a mask geometrical pattern that has been corrected, using the semiconductor device geometrical pattern correction process, by enlargement of an end line of a transistor gate corresponding portion that projects from a concave diffusion layer corresponding portion and enlargement of regions of sides that respectively contact the end line in the transistor corresponding portion, the regions being positioned in the vicinity of both ends of the end line.

According to the invention, there is provided a geometrical pattern extraction process which includes the steps of moving the sides of a geometrical pattern, correcting a geometrical pattern, performing logical operation on the geometrical pattern obtained after the side movement and the geometrical pattern obtained after the correction, and making space measurement in the geometrical pattern obtained after the logical operation

BRIEF DESCRIPTION OF THE DRAWINGS

FIG. 3(a) illustrates a diffusion layer geometrical pattern according to the first embodiment, FIG. 3(b) illustrates a geometrical pattern obtained after side movement (reduction), FIG. 3(c) illustrates a geometrical pattern obtained after correction (reduction), FIG. 3(d) illustrates a geometrical pattern obtained after logical operation (subtraction), and FIG. 3(e) illustrates a diffusion layer geometrical pattern as a detection result.

FIG. 4 is a process drawing showing the details of the OPC step 103 of the first embodiment shown in FIG. 1.

FIG. 5(a) illustrates a diffusion layer geometrical pattern of the first embodiment, FIG. 5(b) illustrates a geometrical pattern obtained after detection of a concave diffusion layer, and FIG. 5(c) illustrates a geometrical pattern obtained after OPC.

FIG. 9(a) illustrates a diffusion layer geometrical pattern according to the second embodiment, FIG. 9(b) illustrates a geometrical pattern obtained after correction (enlargement), and FIG. 9(c) illustrates a geometrical pattern obtained after OPC.

FIG. 13(a) illustrates a geometrical pattern after displacement measurement according to the third embodiment, FIG. 13(b) illustrates a geometrical pattern after correction (enlargement), FIG. 13(c) illustrates a geometrical pattern after correction (enlargement), FIG. 13(d) illustrates a geometrical pattern after logical operation (multiplication), FIG. 13(e) illustrates a geometrical pattern after logical operation (multiplication), FIG. 13(f) illustrates a geometrical pattern after logical operation (subtraction), FIG. 13(g) illustrates a geometrical pattern after correction (enlargement) and FIG. 13(h) illustrates a geometrical pattern after logical operation (addition).

FIG. 17(b) illustrates a geometrical pattern after side movement (enlargement), FIG. 17(c) illustrates a geometrical pattern after correction (enlargement), FIG. 17(d) illustrates a geometrical pattern after logical operation (subtraction), FIG. 17(e) illustrates a geometrical pattern after correction (enlargement), FIG. 17(f) illustrates a geometrical pattern after logical operation (subtraction), FIG. 17(g) illustrates a geometrical pattern after correction (enlargement) and FIG. 17(h) illustrates a geometrical pattern after logical operation (addition).

FIGS. 20(a)–20(e) illustrate a concave geometrical pattern extraction process employed in a detection step corresponding to one shown in FIG. 3, wherein FIG. 20(a) illustrates a convex geometrical pattern, FIG. 20(b) illustrates a geometrical pattern after side movement (enlargement), FIG. 20(c) illustrates a geometrical pattern after correction (enlargement), FIG. 20(d) illustrates a geometrical pattern after logical operation (subtraction), and FIG. 20(e) illustrates a diffusion layer geometrical pattern as a detection result.

DESCRIPTION OF THE PREFERRED EMBODIMENTS

Referring now to the accompanying drawings, preferred embodiments of the present invention will be described below.

Figure 1:
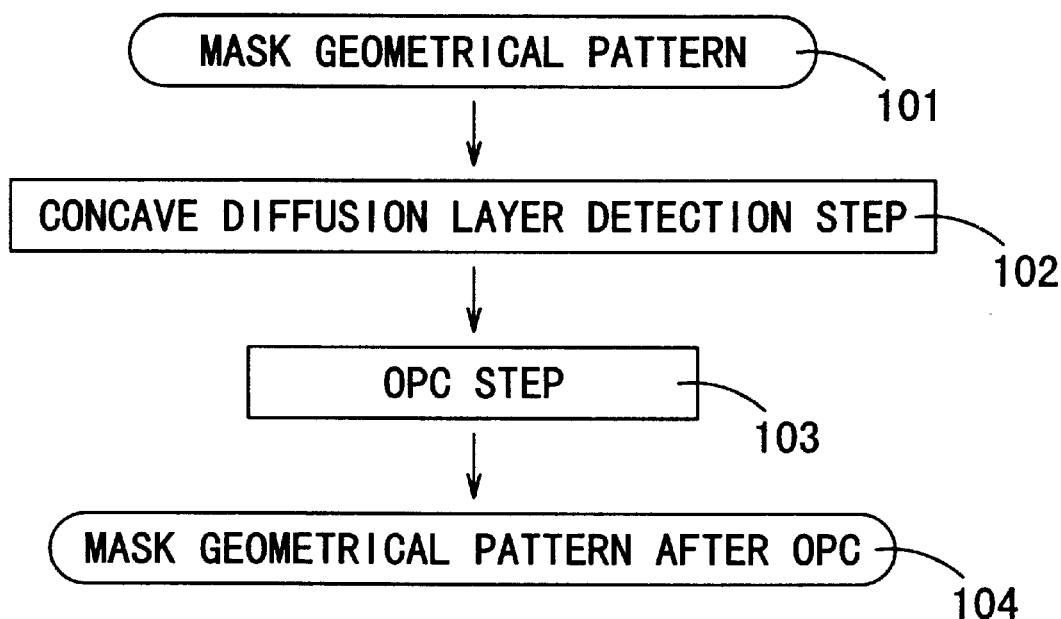
FIG. 1 is a process drawing showing a process of correcting a mask geometrical pattern for semiconductor devices according to a first embodiment of the invention.

FIG. 1 shows a process of correcting a mask geometrical pattern for semiconductor devices according to a first embodiment of the invention.

A mask geometrical pattern 101 shown in FIG. 1 is input for processing at a concave diffusion layer detection step 102 and then subject to processing at an OPC step 103 in which Optical Proximity Correction (hereinafter referred to as OPC) is performed for compensating for the difference between a mask geometrical pattern initially designed and a geometrical pattern after transferring. Thereafter, a mask geometrical pattern 104 after OPC is output.

Figure 2:
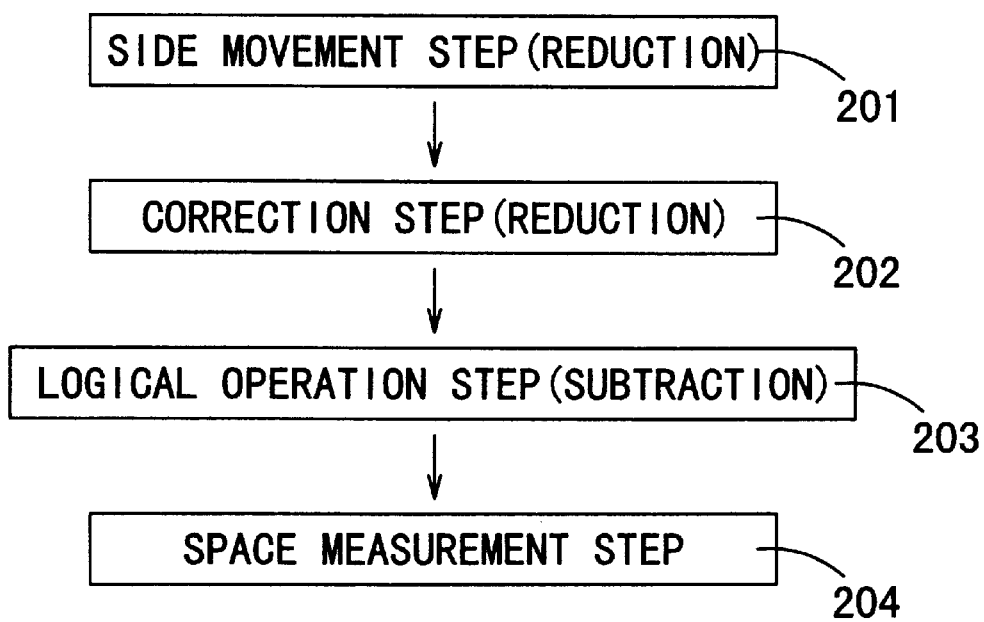
FIG. 2 is a process drawing showing the details of a concave diffusion layer detecting step 102.

FIG. 2 is a process drawing showing the concave diffusion layer detection step 102 in detail. As seen from FIG. 2, a diffusion layer geometrical pattern undergoes a side movement (reduction) step 201, a correction (reduction) step 202, a logical operation (subtraction) step 203 and a space measurement step 204, whereby a concave diffusion layer is detected. The above series of steps constitutes a concave geometrical pattern extraction process applied to the concave diffusion layer detection step 102.

The diffusion layer geometrical pattern shown in FIG. 3(a) is subject to side movement by a specified amount A in the side movement (reduction) step 201 so that the geometrical pattern shown in FIG. 3(b) is output. The diffusion layer geometrical pattern is also subject to correction (reduction) by the specified amount A in a correction (reduction) step 202 thereby to release the geometrical pattern shown in FIG. 3(c). The geometrical patterns shown in FIGS. 3(b) and 3(c) undergo logical operation (subtraction) in the logical operation (subtraction) step 203 to output the geometrical pattern shown in FIG. 3(d). The geometrical pattern shown in FIG. 3(d) then undergoes space measurement in the space measurement step 204 so that the geometrical pattern shown in FIG. 3(e) is output to areas having spaces equal to or less than a specified amount B. The geometrical pattern shown in FIG. 3(e) is a result of the detection of the concave diffusion layer.

FIG. 4 shows a logical operation step 301 that is a detail step of the OPC step 103 according to the first embodiment of the invention. In the logical operation (subtraction) step 301, the diffusion layer geometrical pattern shown in FIG. 5(a) undergoes logical operation (subtraction) together with the geometrical pattern shown in FIG. 5(b) which is an output from the concave diffusion layer detection step 102, so that the geometrical pattern shown in FIG. 5(c) is output.

The amount of correction carried out in the OPC step 103 can be controlled by altering the specified amount A used in the side movement (reduction) step 201 and in the correction (reduction) step 202.

Figure 6:
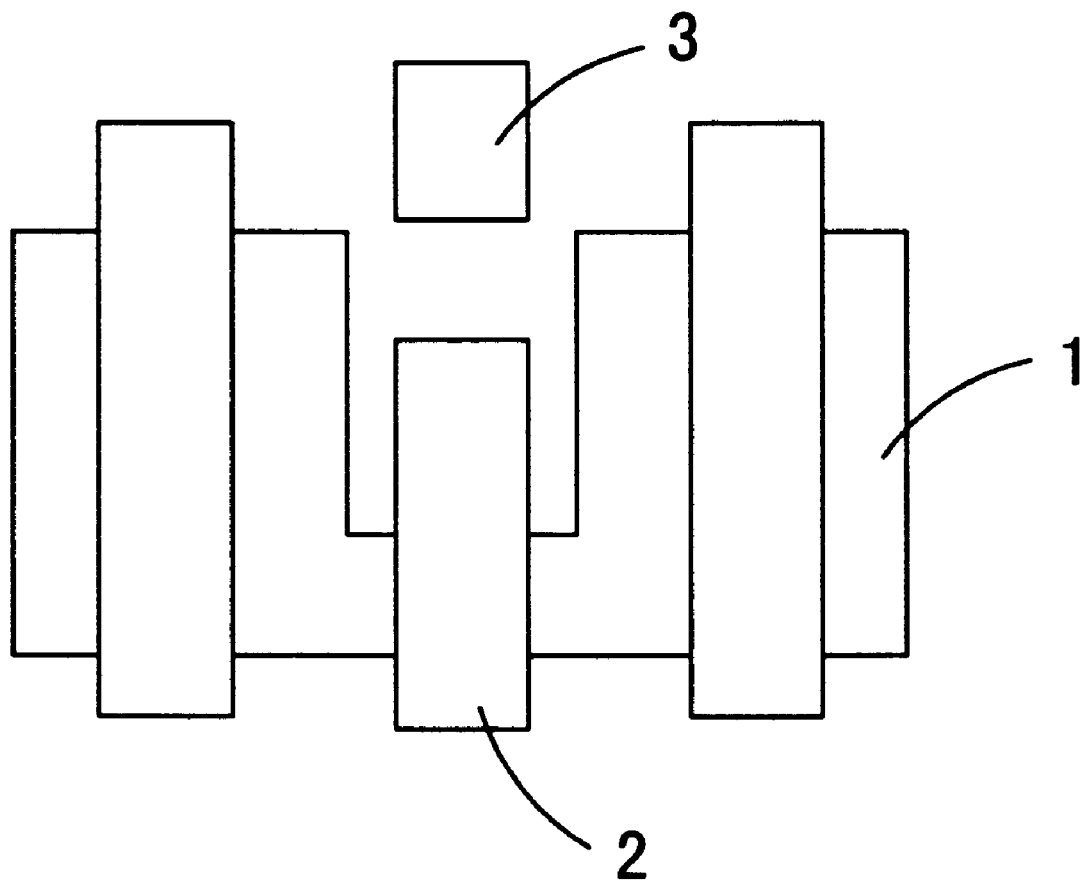
FIG. 6 illustrates a geometrical pattern obtained by OPC according to the first embodiment.
Figure 7:
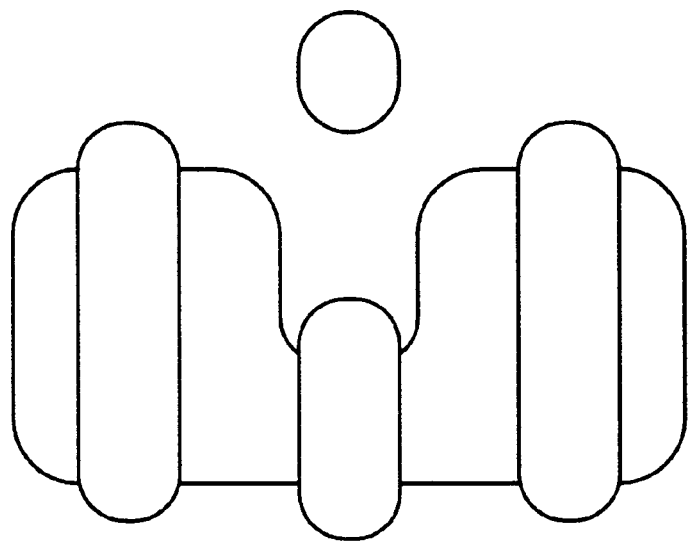
FIG. 7 illustrates a geometrical pattern obtained after transferring in OPC according to the first embodiment.

FIGS. 6 and 7 show geometrical patterns corrected by the semiconductor device mask geometrical pattern correction process according to the first embodiment of the invention. Reference numerals 1, 2 and 3 designate a concave diffusion layer corresponding portion, a gate corresponding portion, and another pattern, respectively.

The semiconductor device mask geometrical pattern shown in FIG. 6 is such a pattern that can ensure a desired gate projection amount after transferring as seen from FIG. 7 while allowing the placement of another pattern 3.

A decrease in the projection amount of the gate caused by corner rounding induced after the photographic step can be compensated in the semiconductor device produced by photographing with the above corrected semiconductor device mask geometrical pattern.

In accomplishing the above primary object, the invention does not cause increased chip area which is a problem imposed by conventional techniques, so that the invention can highly contribute to the development of competitive chips. Further, since the process of the invention is focused on the compensation for a decrease in the projection amount of the gate, the amount of data that accompany the process can be minimized and no problems occur in mask fabrication.

Figure 8:
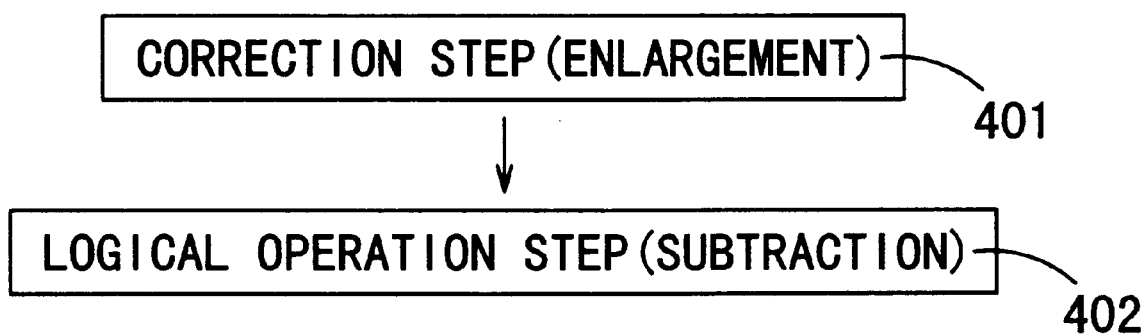
FIG. 8 is a process drawing showing a part of a process of correcting a semiconductor device mask geometrical pattern according to a second embodiment of the invention.

FIG. 8 shows a part of a semiconductor device mask geometrical pattern correction process according to a second embodiment of the invention. The process of the second embodiment can be implemented by replacing the OPC step 103 of the first embodiment with the OPC step shown in FIG. 8.

The geometrical pattern shown in FIG. 3(d) which is generated in the concave diffusion layer detection step 102 undergoes correction (enlargement) by a specified amount C in a correction (enlargement) step 401 shown in FIG. 8 so that the geometrical pattern shown in FIG. 9(b) is output. In a logical operation (subtraction) step 402, logical operation (subtraction) on the geometrical patterns shown in FIGS. 9(a) and 9(b) is performed so that the geometrical pattern shown in FIG. 9(c) is output.

It should be noted that the amount of correction in the OPC step 103 can be controlled by altering the specified amount C used in the correction (enlargement) step 401.

Figure 10:
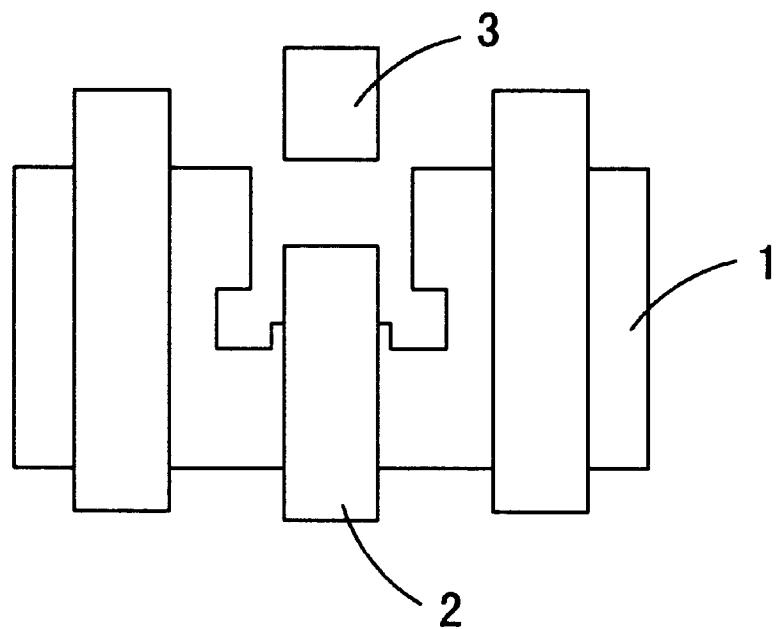
FIG. 10 illustrates a geometrical pattern obtained by OPC according to the second embodiment.
Figure 11:
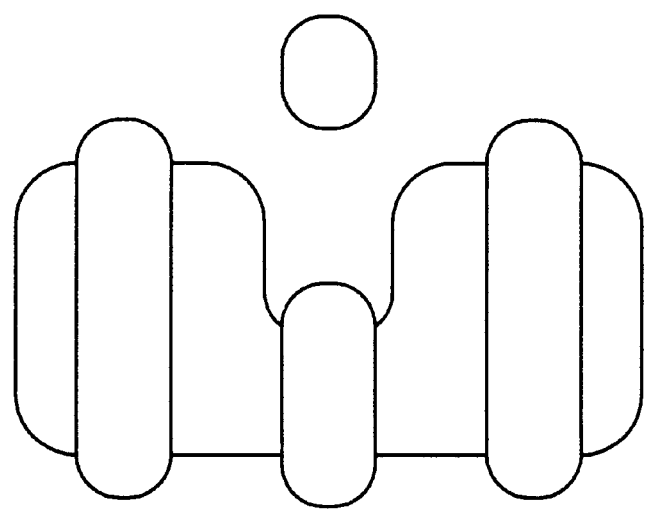
FIG. 11 illustrates a geometrical pattern obtained after transferring in OPC according to the second embodiment.

FIGS. 10 and 11 show geometrical patterns corrected by the semiconductor device mask geometrical pattern correction process according to the second embodiment.

The semiconductor device mask geometrical pattern shown in FIG. 10 is such a pattern that can ensure a desired gate projection amount after transferring as seen from FIGURE11 while allowing the placement of another pattern 3.

Figure 12:
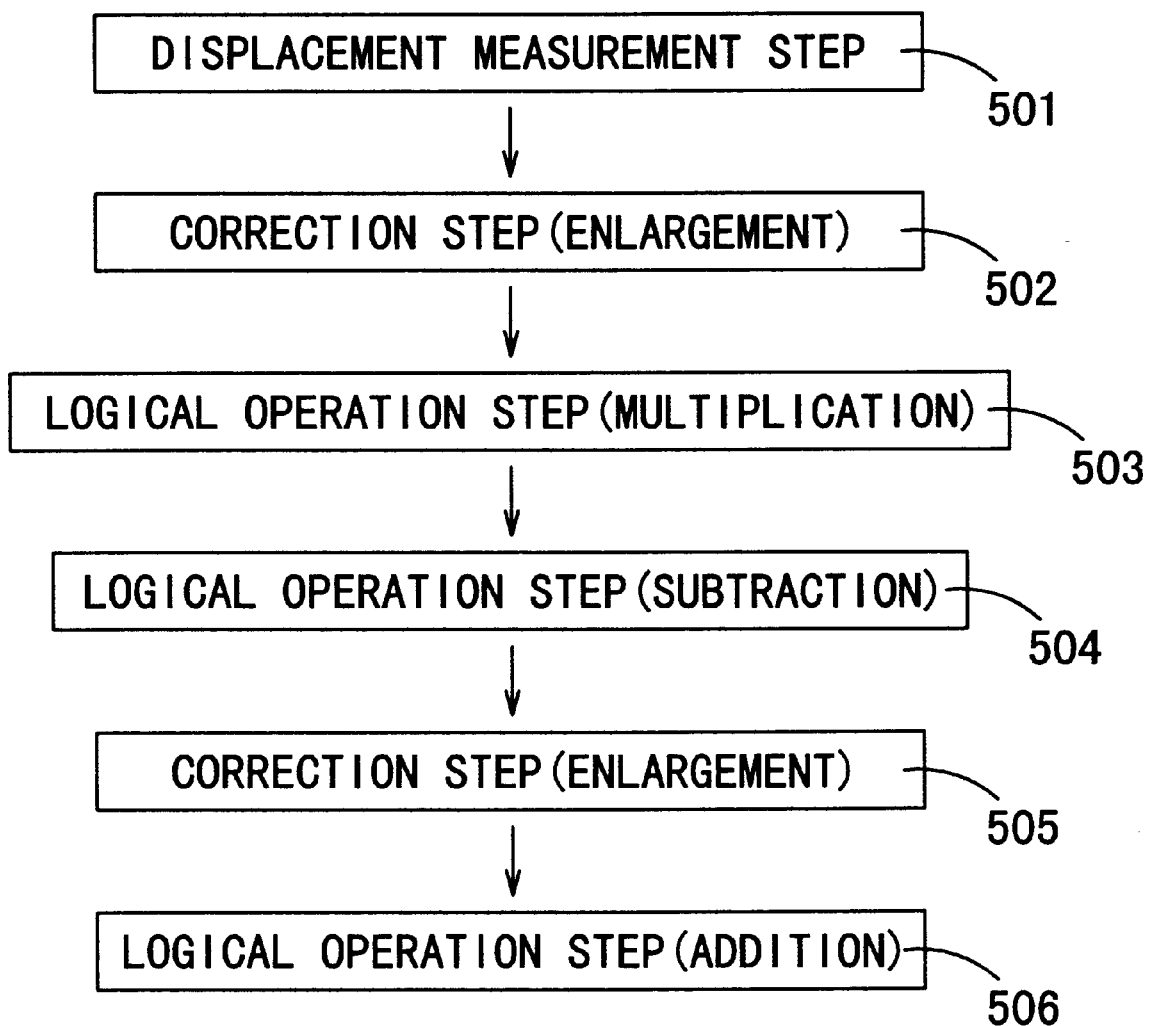
FIG. 12 is a process drawing showing a part of a process of correcting a semiconductor device mask geometrical pattern according to a third embodiment of the invention.

FIG. 12 shows a part of a semiconductor device mask geometrical pattern correction process according to a third embodiment of the invention. The process of the third embodiment can be implemented by replacing the OPC step 103 of the first embodiment with the OPC step shown in FIG. 12.

The diffusion layer geometrical pattern and transistor gate geometrical pattern shown in FIG. 13(a) undergo displacement measurement in a displacement measurement step 501 so that the geometrical pattern shown in FIG. 13(a) is output to areas having values less than a specified amount D. Further, the geometrical pattern shown in FIG. 13(a) undergoes correction (enlargement) by a specified amount E in the correction (enlargement) step 502 so that the geometrical pattern shown in FIG. 13(b) is output. The geometrical pattern shown in FIG. 13(a) undergoes correction (enlargement) by a specified amount F in the correction (enlargement) step 502 so that the geometrical pattern shown in FIG. 13(c) is output.

In a logical operation (multiplication) step 503, logical operation (multiplication) on the geometrical pattern shown in FIG. 13(b) and the transistor gate geometrical pattern shown in FIG. 13(a) is performed so that the geometrical pattern shown in FIG. 13(d) is output. Further, in a logical operation (multiplication) step 503, logical operation (multiplication) on the geometrical pattern shown in FIG. 13(c) and the transistor gate geometrical pattern shown in FIG. 13(a) is performed so that the geometrical pattern shown in FIG. 13(e) is output. Then, in a logical operation (subtraction) step 504, logical operation (subtraction) on the geometrical patterns shown in FIG. 13(d) and 13(e) is performed so that the geometrical pattern shown in FIG. 13(f) is output. The geometrical pattern shown in FIG. 13(f) undergoes correction (enlargement) by a specified amount G in a correction (enlargement) step 505 so that the geometrical pattern shown in FIG. 13(g) is released. Lastly, in a logical operation (addition) step 506, logical operation (addition) on the geometrical pattern shown in FIG. 13(g) and the transistor gate geometrical pattern shown in FIG. 13(a) is performed so that the geometrical pattern shown in FIG. 13(h) is released.

The amount of correction carried out in the OPC step 103 can be controlled by altering the specified amount D used in the displacement measurement step 501, the specified amount E used in the correction (enlargement) step 502, the specified amount F used in the correction (enlargement) 502, and the specified amount G used in the correction (enlargement) step 505.

Figure 14:
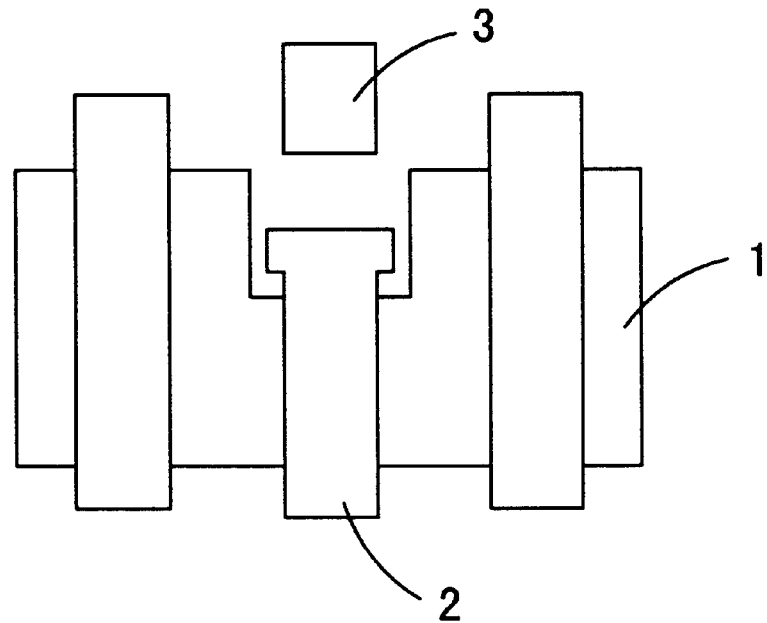
FIG. 14 illustrates a geometrical pattern obtained by OPC according to the third embodiment.
Figure 15:
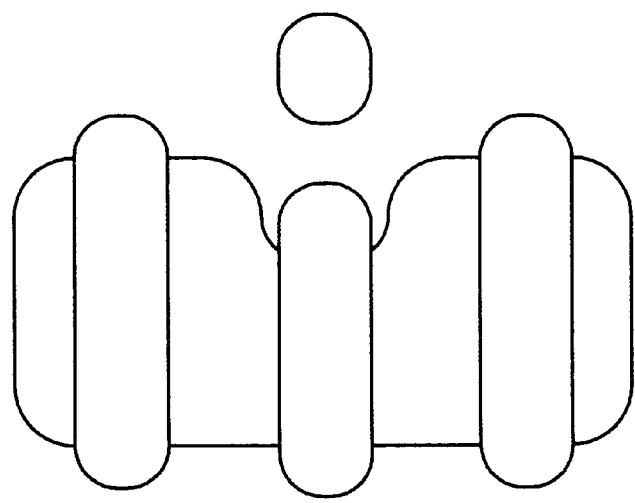
FIG. 15 illustrates a geometrical pattern obtained after transferring in OPC according to the third embodiment.

FIGS. 14 and 15 show geometrical patterns corrected by the semiconductor device mask geometrical pattern correction process according to the third embodiment of the invention.

The semiconductor device mask geometrical pattern shown in FIG. 14 is such a pattern that can ensure a desired gate projection amount after transferring as seen from FIG. 15 while allowing the placement of another pattern 3.

Figure 16:
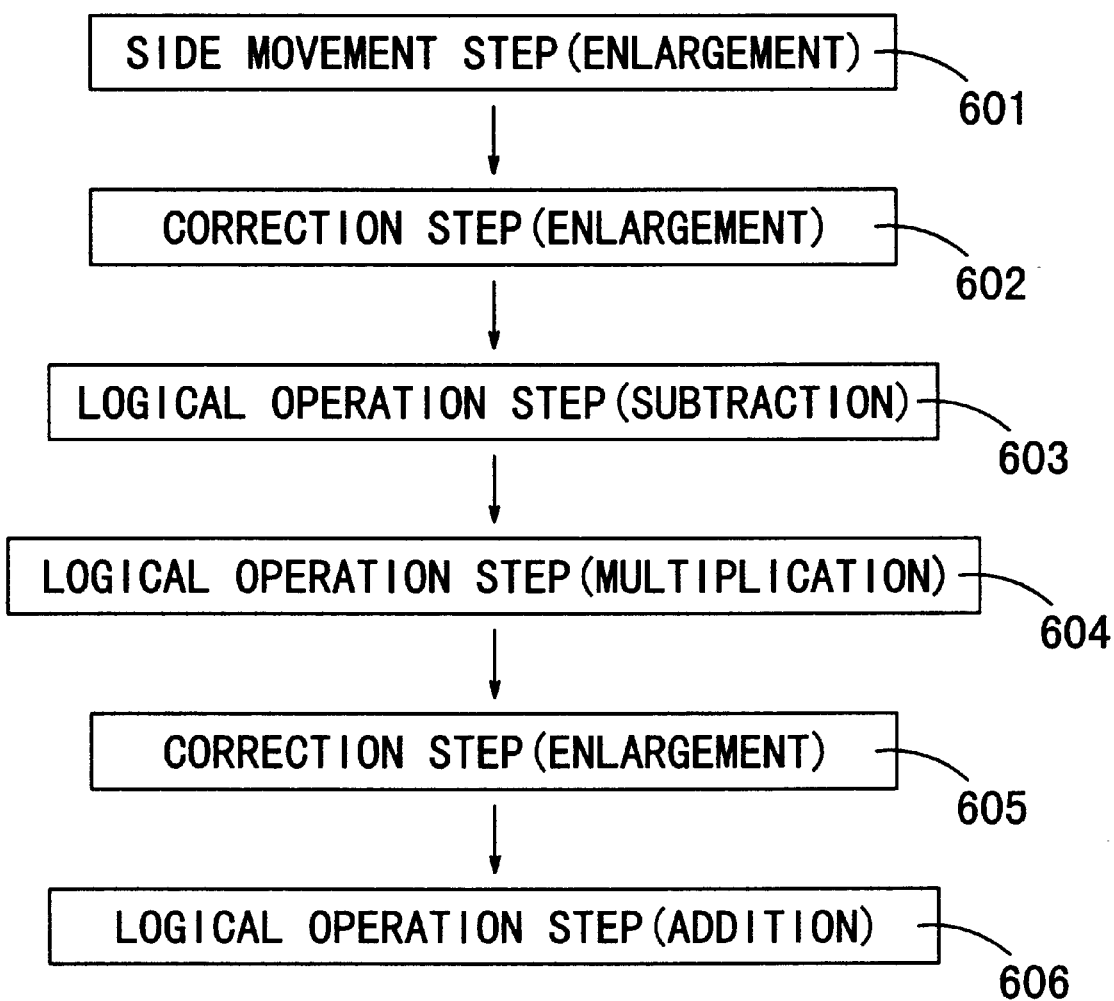
FIG. 16 is a process drawing showing a part of a process of correcting a semiconductor device mask geometrical pattern according to a fourth embodiment of the invention.

FIG. 16 shows a part of a semiconductor device mask geometrical pattern correction process according to a fourth embodiment of the invention. The process of the fourth embodiment can be implemented by replacing the OPC step 103 of the first embodiment with the OPC step shown in FIG. 16. The transistor gate geometrical pattern shown in FIG. 17(a) undergoes side movement (enlargement) by a specified amount H in a side movement (enlargement) step 601 to output the geometrical pattern shown in FIG. 17(b). The transistor gate geometrical pattern shown in FIG. 17(a) undergoes correction (enlargement) by a specified amount H in a correction (engagement) step so that the geometrical pattern shown in FIG. 17(c) is output. Subsequently, logical operation (subtraction) on the geometrical patterns shown in FIGS. 17(b) and 17(c) is performed in a logical operation (subtraction) step 603 so that the geometrical pattern shown in FIG. 17(d) is output. In a logical operation (multiplication) step 604, logical operation (multiplication) is performed on the geometrical patterns shown in FIGS. 17(e) and 17(d) which have been obtained by correction (enlargement) with the specified amount H as a correction amount in a similar manner to the displacement measurement step 501 and correction (enlargement) step 502 shown in FIG. 12, so that the geometrical pattern shown in FIG. 17(f) is output. The geometrical pattern shown in FIG. 17(f) then undergoes correction (enlargement) by a specified amount I in a correction (enlargement) step 605 to release the geometrical pattern shown in FIG. 17(g). Lastly, logical operation (addition) on the geometrical pattern shown in FIG. 17(g) and the transistor gate geometrical pattern shown in FIG. 17(a) is performed in a logical operation (addition) step 606 so that the geometrical pattern shown in FIG. 17(h) is output.

Figure 17:
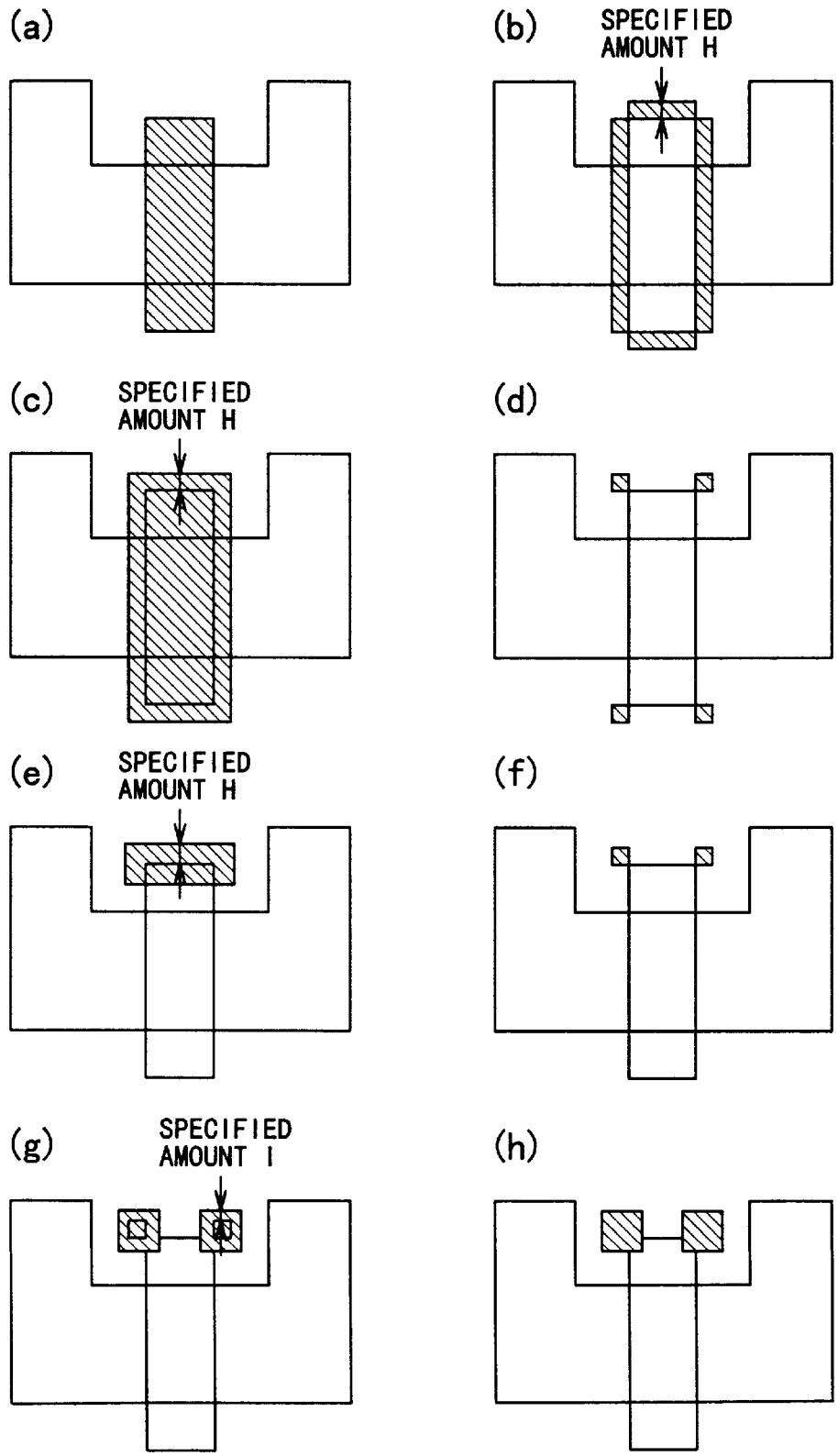
FIG. 17 illustrates a geometrical pattern of a transistor gate according to the fourth embodiment.

The amount of correction in the OPC step 103 can be controlled by altering the specified amount H used in the side movement step 601, the specified amount H used in the correction (enlargement) step 602, the specified amount H used in generating the pattern shown in FIG. 17(e) and the specified amount I used in the correction (enlargement) step 605.

Figure 18:
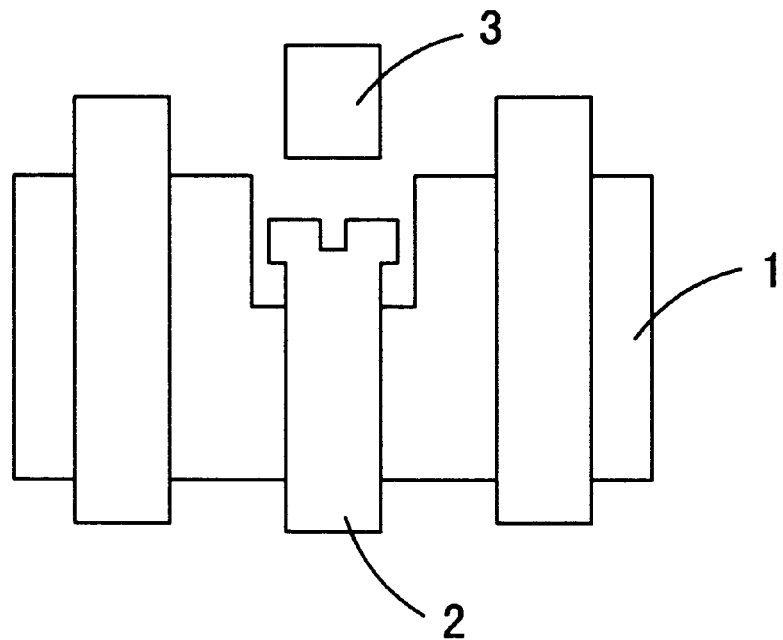
FIG. 18 illustrates a geometrical pattern obtained by OPC according to the fourth embodiment.
Figure 19:
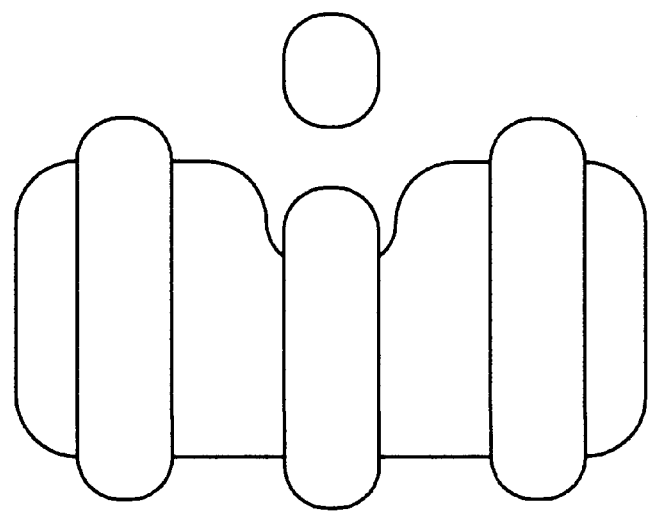
FIG. 19 illustrates a geometrical pattern after transferring in OPC according to the fourth embodiment.
Figure 21:
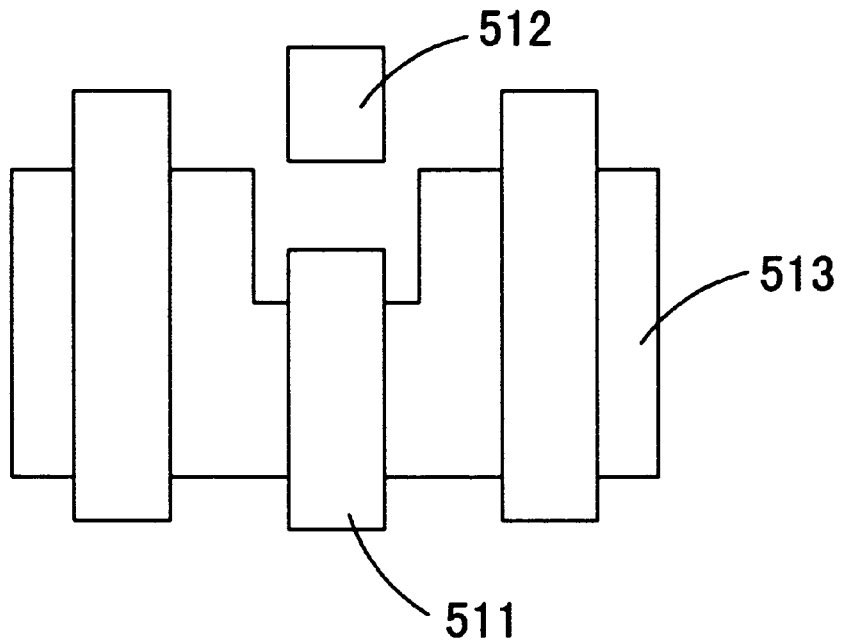
FIG. 21 illustrates a geometrical pattern prepared according to one example of conventional techniques.
Figure 22:
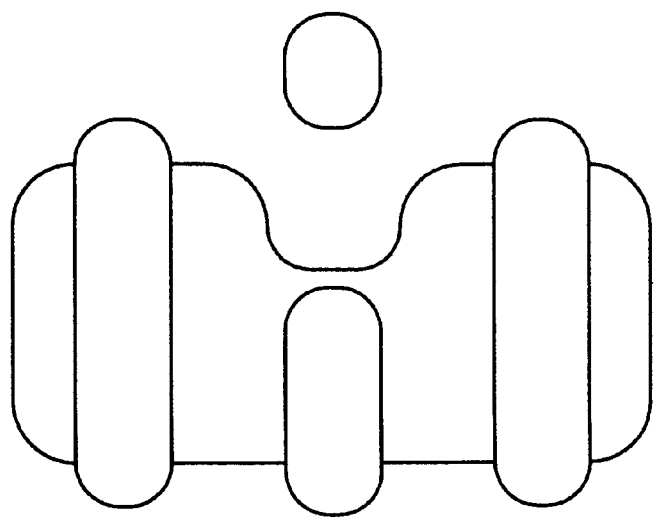
FIG. 22 illustrates a geometrical pattern obtained after transferring of the pattern shown in FIG. 21.
Figure 23:
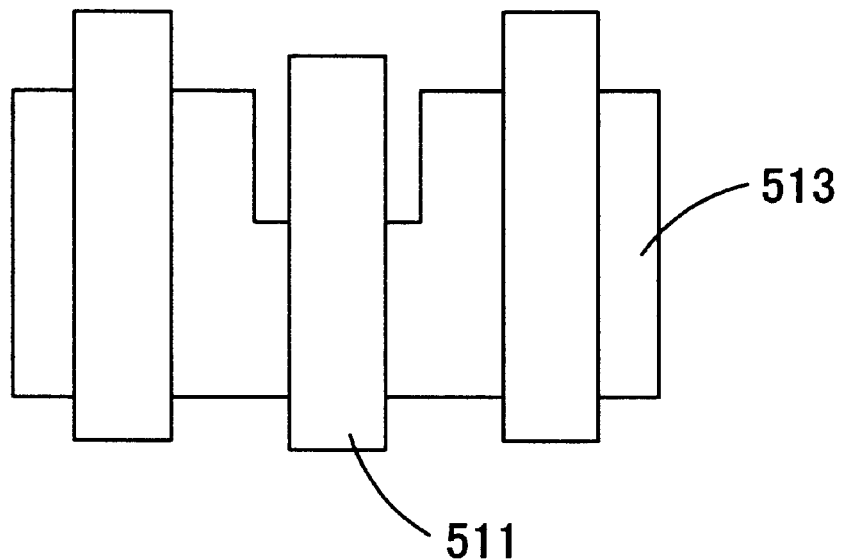
FIG. 23 illustrates a geometrical pattern prepared according to another example of conventional techniques, the pattern being modified for ensuring the projection amount of a transistor gate.
Figure 24:
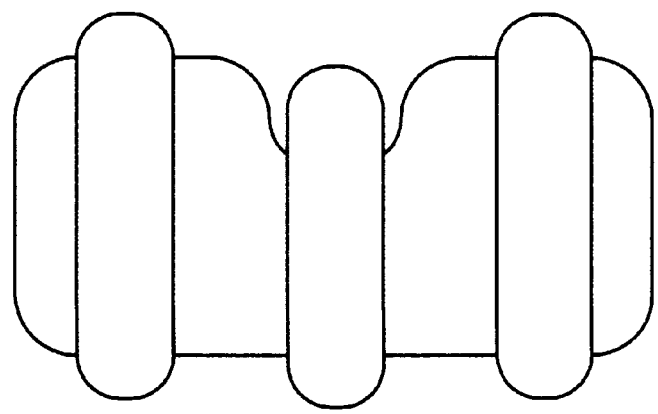
FIG. 24 illustrates a geometrical pattern obtained after transferring of the pattern with modification shown in FIG. 23.

FIGS. 18 and 19 show geometrical patterns corrected by the semiconductor device mask geometrical pattern correction process according to the fourth embodiment of the invention.

The semiconductor device mask geometrical pattern shown in FIG. 18 is such a pattern that can ensure a desired gate projection amount after transferring as seen from FIG. 19 while allowing the placement of another pattern 3.

In the geometrical pattern extraction process of the invention, the side movement (reduction) step and correction (reduction) step in the concave diffusion layer detection step are changed to a side movement (enlargement) step and correction (enlargement) step, respectively, whereby this process can be utilized as a convex pattern detection step.

FIG. 20 corresponds to FIG. 3 and illustrates a process of extracting a convex geometrical pattern.

FIGS. 20(a), 20(b), 20(c), 20(d) and 20(e) illustrate (i) a convex geometrical pattern, (ii) a geometrical pattern after undergoing side movement in a side movement (enlargement) step, (iii) a geometrical pattern after undergoing correction in a correction (enlargement) step, (iv) a geometrical pattern obtained from logical operation (subtraction) performed on the geometrical patterns shown in FIGS. 20(b) and 20(c), and (v) a geometrical pattern outputted, as a detection result, to areas having spaces equal to or less than a specified amount after undergoing space measurement in a space measurement step.

It will be appreciated that the invention is not limited to cases where either the concave diffusion layer corresponding portion or the transistor gate corresponding portion which projects from the concave diffusion layer corresponding portion is corrected, but can be arranged such that both of them are corrected by employing any of the first to fourth embodiments in combination.

What is claimed is:

1. A geometrical pattern correction method for a semiconductor device, said method comprising the steps of:

detecting a diffusion layer corresponding concave shape; and correcting by indenting an inner bottom surface of said diffusion layer corresponding concave shape in order to ensure the projection of a gate from an inside of said diffusion layer corresponding concave shape for the purpose of preventing corner rounding.

2. A geometrical pattern correction method for a semiconductor device, said method comprising the steps of:

detecting a diffusion layer corresponding concave shape; and correcting by indenting corners on both sides of an inner bottom surface of said diffusion layer corresponding concave shape in order to ensure the projection of a gate from an inside of said diffusion layer corresponding concave shape for the purpose of preventing corner rounding.

3. A geometrical patten correction method for a semiconductor device, said method comprising the steps of:

detecting a diffusion layer corresponding concave shape; and correcting by making project outward both sides of an edge of a transistor gate corresponding part projecting from an inside of said diffusion layer corresponding concave shape in order to ensure the projection of said gate from said inside ofthe diffusion layer corresponding concave shape for the purpose of preventing corner rounding.

4. A geometrical pattern correction method for a semiconductor device, said method comprising the steps of:

detecting a diffusion layer corresponding concave shape; and correcting by making project outward both corners of an edge of a transistor gate corresponding part projecting from an inside of said diffusion layer corresponding concave shape in order to ensure the projection of said gate from said inside of the diffusion layer corresponding concave shape for the purpose of preventing corner rounding.

5. A geometrical pattern correction method for a semiconductor device according to claim 1, said method further comprising the step of correcting by making project outward both sides of an edge of a transistor gate corresponding part projecting from said inside of the diffusion layer corresponding concave shape.

6. A geometrical pattern correction method for a semiconductor device according to claim 2, said method further comprising the step of correcting by making project outward both sides of an edge of a transistor gate corresponding part projecting from said inside of the diffusion layer corresponding concave shape.

7. A geometrical pattern correction method for a semiconductor device according to claim 1, said method further comprising the step of correcting by making project outward both corners of an edge of a transistor gate corresponding part projecting from said inside of the diffusion layer corresponding concave shape.

8. A geometrical pattern correction method for a semiconductor device according to claim 2, said method further comprising the step of correcting by making project outward both corners of an edge of a transistor gate corresponding part projecting from said inside of the diffusion layer corresponding concave shape.

9. A geometrical pattern correction method for a semiconductor device according to claim 1, wherein said step of detecting the diffusion layer corresponding concave shape comprises:

translating each of the sides of a geometric pattern by a predetermined amount so that said geometric pattern is scaled down;

altering said scaling down of said geometric pattern by the same amount as said predetermined amount;

logically operating a geometric pattern which logically operates so as to subtract said altered geometric pattern from the geometric pattern of which the sides are translated; and measuring a gap of said geometric pattern logically calculated by said logical operation.

10. A geometrical pattern correction method for a semiconductor device according to claim 2, wherein said step of detecting the diffusion layer corresponding concave shape comprises:

translating each of the sides of a geometric pattern by a predetermined amount so that said geometric pattern is scaled down;

altering said scaling down of said geometric pattern by the same amount as said predetermined amount;

logically operating a geometric pattern which logically operates so as to subtract said altered geometric pattern from the geometric pattern of which the sides are translated; and measuring a gap of said geometric pattern logically calculated by said logical operation.

11. A geometrical pattern correction method for a semiconductor device according to claim 5, wherein said step of detecting the diffusion layer corresponding concave shape comprises:

translating each of the sides of a geometric pattern by a predetermined amount so that said geometric pattern is scaled down;

altering said scaling down of said geometric pattern by the same amount as said predetermined amount;

logically operating a geometric patten which logically operates so as to subtract said altered geometric pattern from the geometric patten of which the sides are translated; and measuring a gap of said geometric pattern logically calculated by said logical operation.

12. A geometrical pattern correction method for a semiconductor device according to claim 6, wherein said step of detecting the diffusion layer corresponding concave shape comprises:

translating each of the sides of a geometric pattern by a predetermined amount so that said geometric pattern is scaled down;

altering said scaling down of said geometric pattern by the same amount as said predetermined amount;

logically operating a geometric pattern which logically operates so as to subtract said altered geometric pattern from the geometric pattern of which the sides are translated; and measuring a gap of said geometric pattern logically calculated by said logical operation.

13. A semiconductor device manufacturing process comprising a photographic step corrected by a geometrical pattern correction method for a semiconductor device according to claim 1.

14. A semiconductor device manufacturing process comprising a photographic step corrected by a geometrical pattern correction method for a semiconductor device according to claim 2.

15. A semiconductor device manufacturing process comprising a photographic step corrected by a geometrical pattern correction method for a semiconductor device according to claim 3.

16. A semiconductor device manufacturing process comprising a photographic step corrected by a geometrical pattern correction method for a semiconductor device according to claim 4.

17. A semiconductor device manufacturing process comprising a photographic step corrected by a geometrical pattern correction method for a semiconductor device according to claim 5.

18. A semiconductor device manufacturing process comprising a photographic step corrected by a geometrical pattern correction method for a semiconductor device according to claim 6.

19. A semiconductor device manufacturing process comprising a photographic step corrected by a geometrical pattern correction method for a semiconductor device according to claim 7.

20. A semiconductor device manufacturing process comprising a photographic step corrected by a geometrical pattern correction method for a semiconductor device according to claim 8.

21. A geometrical pattern sampling method comprising the steps of:

translating each of the sides of a geometric pattern by a predetermined amount so that said geometric pattern is scaled down or scaled up;

altering said scaling down or scaling up of said geometric pattern by the same amount as said predetermined amount;

logically operating a geometric pattern which logically operates so as to subtract said altered geometric pattern from the geometric pattern of which the sides are translated; and measuring a gap of said geometric pattern logically calculated by said logical operation.

* * * * *